(12) United States Patent
Butler et al.

(10) Patent No.: US 10,760,312 B2
(45) Date of Patent: Sep. 1, 2020

(54) REFRIGERATION CONTROL UNIT WITH THREE-AXIS HINGE ASSEMBLY

(71) Applicant: Johnson Controls Technology Company, Milwaukee, WI (US)

(72) Inventors: Tim Butler, Milwaukee, WI (US);
Victor E. Dodge, Milwaukee, WI (US);
Aaron Jerabek, Milwaukee, WI (US);
Kirk Henderson, Milwaukee, WI (US);
Tai P. Luc, Milwaukee, WI (US); Dave P. DeBoer, Milwaukee, WI (US);
Philip L. Bushong, Franklin, WI (US);
Troy Wert, Milwaukee, WI (US);
Debra L. Weich, Milwaukee, WI (US)

(73) Assignee: Johnson Controls Technology Company, Auburn Hills, MI (US)

( * ) Notice: Subject to any disclaimer, the term of this patent is extended or adjusted under 35 U.S.C. 154(b) by 225 days.

(21) Appl. No.: 15/727,462

(22) Filed: Oct. 6, 2017

(65) Prior Publication Data
US 2018/0216380 A1 Aug. 2, 2018

Related U.S. Application Data

(60) Provisional application No. 62/451,611, filed on Jan. 27, 2017.

(51) Int. Cl.
*F25D 3/08* (2006.01)
*E05D 7/085* (2006.01)
(Continued)

(52) U.S. Cl.
CPC ............... *E05D 7/085* (2013.01); *E05D 1/06* (2013.01); *E05D 3/06* (2013.01); *E05D 5/14* (2013.01);
(Continued)

(58) Field of Classification Search
CPC ........................................................ F25D 3/08
See application file for complete search history.

(56) References Cited

U.S. PATENT DOCUMENTS

| 32,482 A | 6/1861 | Lane |
|---|---|---|
| 3,268,158 A | 8/1966 | Abbott |
| (Continued) | | |

FOREIGN PATENT DOCUMENTS

| CN | 201713165 U | 1/2011 |
|---|---|---|
| DE | 2341092 | 2/1974 |
| (Continued) | | |

OTHER PUBLICATIONS

Extended Search Report for European Application No. 18153610.3, dated Oct. 9, 2018, 15 pages.
(Continued)

*Primary Examiner* — Adrian S Wilson
(74) *Attorney, Agent, or Firm* — Foley & Lardner LLP

(57) ABSTRACT

A hinge assembly is provided. The hinge assembly includes a first hinge component and a second hinge component. The first hinge component includes a leaf portion terminating in a first knuckle and a second knuckle. The first knuckle includes a protrusion and the second knuckle includes a recess. The second hinge component is rotatably coupled to the first hinge component and is structurally identical to the first hinge component. The protrusion of the first hinge component is configured to fit within the recess of the second hinge component, and the protrusion of the second hinge component is configured to fit within the recess of the first hinge component.

11 Claims, 13 Drawing Sheets

(51) Int. Cl.
*H05K 5/02* (2006.01)
*E05D 5/14* (2006.01)
*E05D 3/06* (2006.01)
*E05D 7/12* (2006.01)
*F25D 29/00* (2006.01)
*E05D 1/06* (2006.01)
*E05D 7/10* (2006.01)
*G06F 3/0484* (2013.01)

(52) U.S. Cl.
CPC ............ *E05D 7/1077* (2013.01); *E05D 7/12* (2013.01); *F25D 3/08* (2013.01); *F25D 29/005* (2013.01); *H05K 5/0226* (2013.01); *E05D 2005/145* (2013.01); *E05D 2007/128* (2013.01); *E05Y 2900/606* (2013.01); *F25D 2323/024* (2013.01); *G06F 3/0484* (2013.01)

(56) References Cited

U.S. PATENT DOCUMENTS

| | | | | |
|---|---|---|---|---|
| 4,213,310 | A * | 7/1980 | Buss | A47J 41/0044 206/544 |
| 4,238,934 | A * | 12/1980 | Hotta | A47J 39/02 62/371 |
| 4,336,883 | A * | 6/1982 | Krug | A45C 11/20 190/117 |
| 4,515,421 | A * | 5/1985 | Steffes | A45C 11/20 312/351 |
| 4,966,004 | A * | 10/1990 | Midlang | F25D 29/005 200/302.2 |
| 5,265,310 | A | 11/1993 | Ichinokawa | |
| 5,551,558 | A * | 9/1996 | Bureau | A45C 9/00 190/11 |
| 5,865,037 | A * | 2/1999 | Bostic | B65D 81/2038 220/361 |
| 6,026,978 | A * | 2/2000 | Clegg | F25D 3/08 220/592.1 |
| 6,186,351 | B1 * | 2/2001 | Coyle | A47B 75/00 220/23.83 |
| 6,336,552 | B1 * | 1/2002 | Meier | B65D 43/163 206/3 |
| 6,408,634 | B1 | 6/2002 | Choi | |
| 2003/0161113 | A1 | 8/2003 | Wrycraft et al. | |
| 2006/0080994 | A1 * | 4/2006 | Seiden | F25D 11/02 62/441 |
| 2006/0214808 | A1 * | 9/2006 | Fusco | F25D 29/008 340/585 |
| 2008/0047287 | A1 * | 2/2008 | Ruppert | F25D 29/00 62/256 |
| 2013/0047630 | A1 * | 2/2013 | Lu | F25B 21/02 62/3.6 |
| 2016/0187046 | A1 * | 6/2016 | Chen | A45C 11/20 62/239 |
| 2016/0290713 | A1 | 10/2016 | Twiggar et al. | |

FOREIGN PATENT DOCUMENTS

| | | |
|---|---|---|
| DE | 202013103702 | 8/2013 |
| FR | 2673971 A1 | 9/1992 |
| GB | 1057765 | 2/1967 |
| GB | 2183289 | 6/1987 |
| WO | WO 2013/140465 | 9/2013 |

OTHER PUBLICATIONS

Search Report for European Application No. 18153610.3, dated Jun. 6, 2018, 16 pages.

Chinese Office Action issued on CN 201810064156.4 dated Nov. 14, 2019. 11 pages.

* cited by examiner

REFRIGERATION CONTROL UNIT WITH THREE-AXIS HINGE ASSEMBLY

CROSS-REFERENCE TO RELATED PATENT APPLICATIONS

This application claims the benefit of U.S. Provisional Application No. 62/451,611, filed Jan. 27, 2017, incorporated herein by reference in its entirety.

BACKGROUND

The present disclosure relates generally to the field of hardware and control for commercial refrigeration equipment. More specifically, the present disclosure relates to a three-axis symmetrical hinge assembly for an electronics enclosure and a refrigeration control unit user interface.

Many hinge assemblies currently utilized on the enclosures of refrigeration control units require distinct (e.g., right-hand and left-hand) hinge leaf parts, which may be joined together by a separate pin component. A hinge assembly that does not require distinct hinge leaf parts and does not require a separate pin component, thereby reducing the overall number of parts in the assembly would be useful. It would also be advantageous to provide a hinge assembly that facilitates movement in multiple axes for the enclosure components coupled to the hinge assembly.

In addition, refrigeration control units often utilize a limited user interface display that severely restricts the number of characters that may be displayed at a time (e.g., three or four characters). This character restriction means that the user interface is only able to display a short code to indicate a parameter that must be programmed (e.g., selection of a desired refrigerant), or to indicate an event (e.g., a parameter has fallen out of a safe food storage range) which requires remedial action by a user. In order to interpret these codes, a user must cross-reference the displayed code with an installation or service manual. This increases both the time and complexity of the control device programming process. A refrigeration control unit with the ability to display an expanded number of characters would be useful.

SUMMARY OF THE INVENTION

One implementation of the present disclosure relates to a hinge assembly. The hinge assembly includes a first hinge component and a second hinge component. The first hinge component includes a leaf portion terminating in a first knuckle and a second knuckle. The first knuckle includes a protrusion and the second knuckle includes a recess. The second hinge component is rotatably coupled to the first hinge component and is structurally identical to the first hinge component. The protrusion of the first hinge component is configured to fit within the recess of the second hinge component, and the protrusion of the second hinge component is configured to fit within the recess of the first hinge component.

In some embodiments, at least one of the first hinge component and the second hinge component is fabricated from acetal resin.

In some embodiments, at least one of the first protrusion and the first recess has a substantially semi-spherical shape.

In some embodiments, the hinge assembly is configured to couple to an electronic device. The first hinge component is rotatably coupled to a first device enclosure component and the second hinge component is rotatably coupled to a second device enclosure component.

In some embodiments, the electronic device is a refrigeration control unit.

In some embodiments, the first hinge component and the second hinge component each further include a pin member portion. In other embodiments, the pin member portion is configured to permit the first hinge component and the second hinge component to pivotally couple to the first device enclosure component and the second device enclosure component via a snap fit assembly process.

In some embodiments, the first hinge component and the second hinge component each further include a third knuckle and a fourth knuckle. The third knuckle includes a second protrusion and the fourth knuckle includes a second recess. In other embodiments, the second protrusion of the first hinge component is configured to fit within the second recess of the second hinge component, and the second protrusion of the second hinge component is configured to fit within the second recess of the first hinge component.

Another implementation of the present disclosure relates to an electronic device enclosure. The electronic device enclosure includes a first enclosure component and a second enclosure component configured to couple to the first enclosure component to encapsulate electronic device components. The electronic device enclosure further includes a hinge assembly configured to rotatably couple the first enclosure component to the second enclosure component. The hinge assembly includes a first hinge component and a second hinge component. The first hinge component and the second hinge component are structurally identical and include a leaf portion terminating in a first knuckle and a second knuckle. The first knuckle includes a first protrusion and the second knuckle includes a first recess. The first protrusion of the first hinge component is configured to fit within the first recess of the second hinge component, and the first protrusion of the second hinge component is configured to fit within the first recess of the first hinge component.

In some embodiments, at least one of the first hinge component and the second hinge component is fabricated from acetal resin.

In some embodiments, at least one of the first protrusion and the first recess has a substantially semi-spherical shape.

In some embodiments, the electronic device components comprise a refrigeration control unit.

In some embodiments, the first hinge component and the second hinge component each further include a third knuckle and a fourth knuckle, the third knuckle comprising a second protrusion and the fourth knuckle comprising a second recess.

In some embodiments, the second protrusion of the first hinge component is configured to fit within the second recess of the second hinge component, and the second protrusion of the second hinge component is configured to fit within the second recess of the first hinge component.

In some embodiments, the first hinge component and the second hinge component each further include a pin member portion. The pin member portion is configured to pivotally couple to hinge receiving features located on the first enclosure component and the second enclosure component.

Still another implementation of the present disclosure relates to a refrigeration control unit configured to modify an operating condition of a refrigeration unit. The refrigeration control unit includes a first device housing component, a second device housing component, and a hinge assembly configured to rotatably couple the first device housing component to the second device housing component. The refrigeration control unit further includes touch screen controls configured to permit selection of refrigeration unit operating parameters, a liquid crystal display, and a processing circuit communicably coupled to the touch screen controls and the liquid crystal display. The processing circuit is configured to receive a selected refrigeration unit operating parameter via the touch screen controls and transmit a signal to display selected refrigeration unit operating parameters in a scrolling display format on the liquid crystal display.

In some embodiments, the hinge assembly includes a first hinge component and a second hinge component that are structurally identical. The hinge components include a leaf portion terminating in a first knuckle and a second knuckle. The first knuckle includes a first protrusion and the second knuckle includes a first recess. The first protrusion of the first hinge component is configured to fit within the first recess of the second hinge component, and the first protrusion of the second hinge component is configured to fit within the first recess of the first hinge component.

In some embodiments, the first hinge component and the second hinge component each further include a third knuckle and a fourth knuckle. The third knuckle includes a second protrusion and the fourth knuckle includes a second recess.

In some embodiments, the refrigeration unit is a walk-in refrigerator, a cooler, or a freezer.

DETAILED DESCRIPTION

Referring generally to FIGURES, disclosed herein are improvements to a refrigeration control unit. The refrigeration control unit includes various embodiments of a three-axis symmetrical hinge assembly. As discussed herein, three-axis symmetrical hinge assemblies are generally types of hardware configured to rotatably couple to an electronic device enclosure and to permit rotary and/or translational movement of the enclosure components relative to each other. For example, the hinge assembly may be actuated by a user (e.g., by moving one component of the enclosure assembly relative to another component) to open and close an electronics housing. The example implementations described herein provide a hinge assembly comprised of two identical hinge components. Features of the hinge components permit the hinge assembly to rotate about three separate axes.

Figure 2:
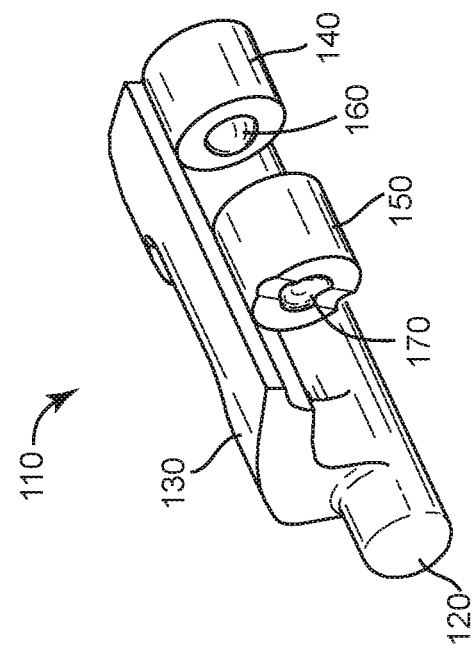
FIG. 2 is a perspective view of a component of the hinge assembly of FIG. 1, according to some embodiments.
Figure 1:
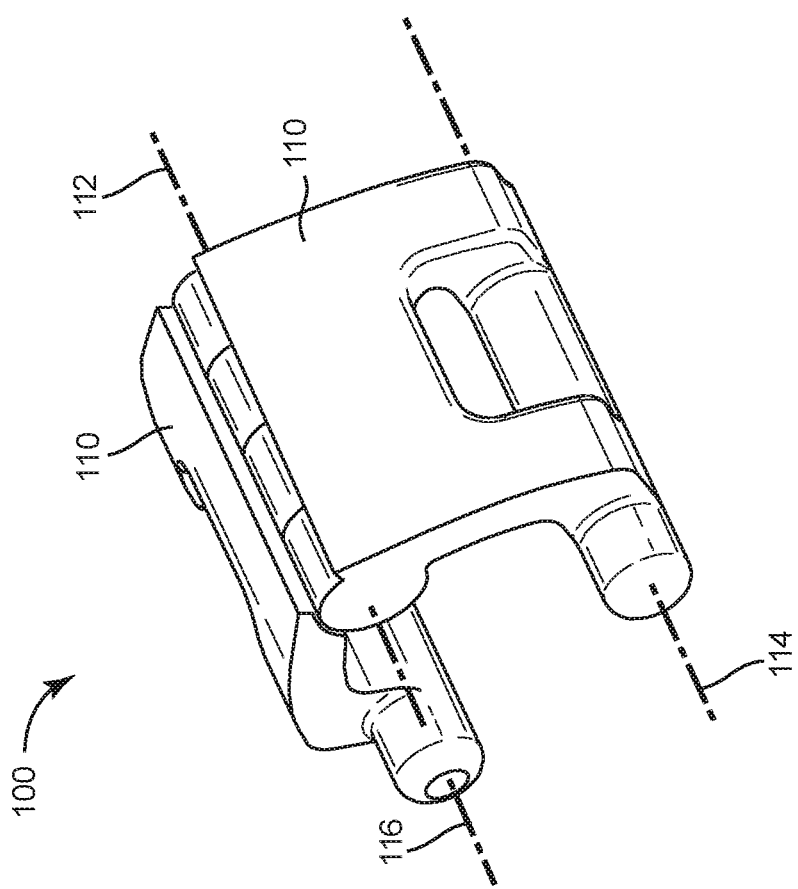
FIG. 1 is a perspective view of a three-axis symmetrical hinge assembly, according to some embodiments.

According to an example implementation illustrated by FIGS. 1 and 2, a hinge assembly 100 includes two hinge components 110 rotatably coupled together along a central axis 112. As shown, assembly 100 has 180 degree rotational symmetry. In other words, one hinge component 110 may be rotated 180 degrees relative to the other hinge component 110 in order to mate the components with each other. Advantageously, no other parts (e.g., hardware, fasteners) are required to couple a first hinge component 110 to a second hinge component 110.

Hinge component 110 is shown to include a pin portion 120 and a leaf portion 130. As described in further detail with reference to FIGS. 3 and 4 below, pin portion 120 may be configured to rotatably couple hinge assembly 100 to an electronics device enclosure via hinge receiving features. The leaf portion 130 of hinge component 110 terminates at a first knuckle 140 and a second knuckle 150. In some embodiments, hinge component 110 is fabricated from acetal resin, otherwise known under the trade name Delrin®. In other embodiments, hinge component may be fabricated from any suitable material (e.g., plastic, metal). In addition, hinge component 110 may be fabricated via any suitable process (e.g., injection molding, machining, 3D printing).

First knuckle 140 is shown to include a detent feature 160, while second knuckle 150 includes an indent feature 170. Detent feature 160 and indent feature 170 may be configured to rotatably couple two hinge components 110 to each other. For example, the detent feature 160 of a first hinge component 110 may be configured to fit (e.g., snap-fit) within the indent feature 170 of a second hinge component 110, and vice versa. As shown, detent feature 160 may include a semi-spherically shaped protrusion, while indent feature 170 may include a semi-spherically shaped recess. However, in other embodiments, detent feature 160 and indent feature 170 may be any compatible shapes required to couple multiple hinge components 110.

Figure 3:
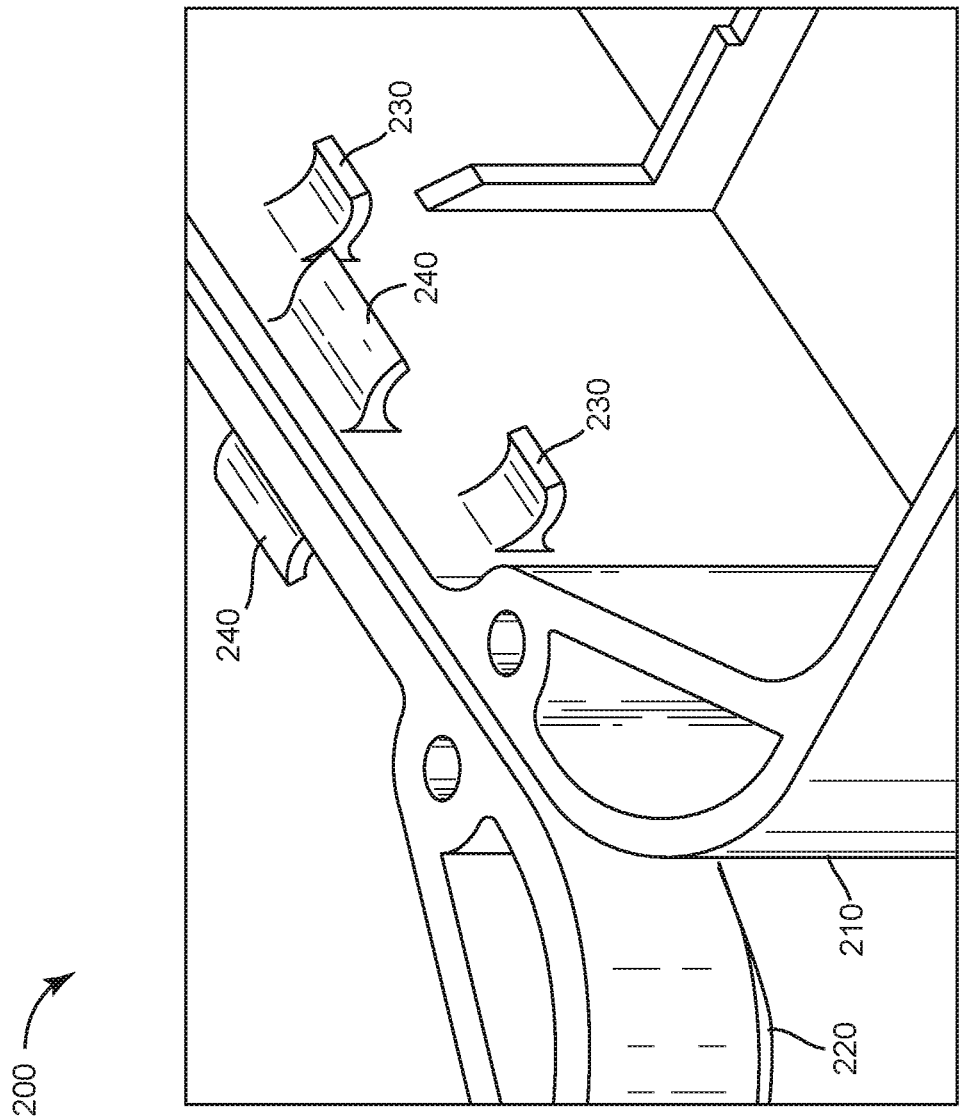
FIG. 3 is a perspective view of an electronics enclosure assembly, according to some embodiments.

Turning now to FIG. 3, a view of an electronics enclosure assembly 200 is depicted, according to an example embodiment. In some embodiments, the electronics enclosure assembly 200 is a housing for a refrigeration control unit. As shown, enclosure assembly 200 may include a first enclosure component 210 and a second enclosure component 220. In various embodiments, first enclosure component 210 and second enclosure component 220 are representative of a front half and back half of a device housing, or alternatively, a top cover and a bottom cover of a device housing.

Both first enclosure component 210 and second enclosure component 220 may include a plurality of lower hinge receiving features 230 and upper hinge receiving features 240. For example, hinge receiving features 230 and 240 may include protrusions from a wall of each of the enclosure components 210 and 220. The protrusions may have a substantially curved shape and may be configured to receive and retain a feature of hinge component 110 (e.g., pin portion 120). However, in various embodiments, enclosure components 210 and 220 may include hinge receiving features 230 and 240 of any size, shape, or number required to rotatably couple hinge assembly 100 to electronics enclosure assembly 200.

Figure 4:
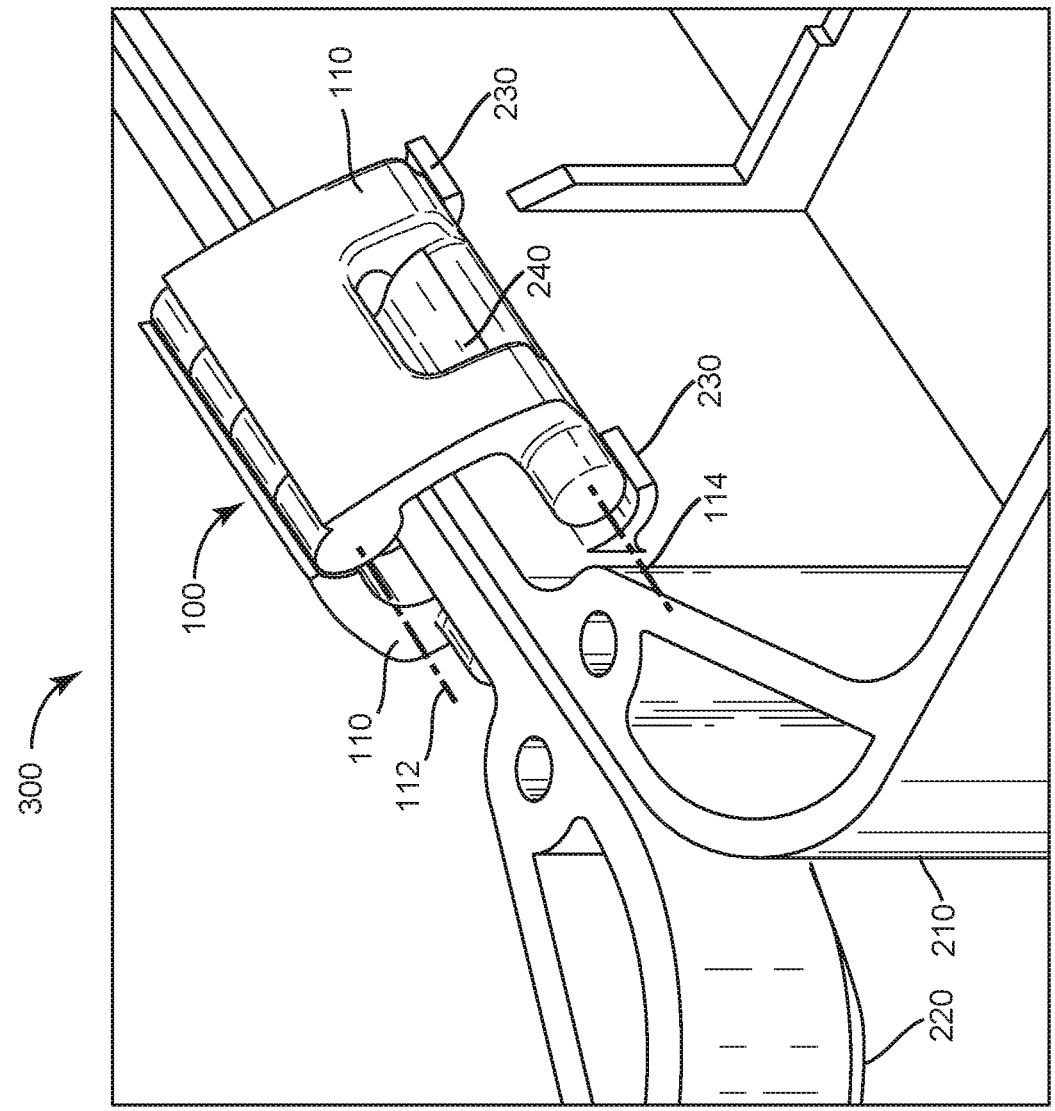
FIG. 4 is a perspective view of the hinge assembly of FIG. 1 installed in the electronics enclosure assembly of FIG. 3, according to some embodiments.

Referring now to FIG. 4, a view of installed hinge enclosure assembly 300 is shown, according to an example embodiment. As shown, assembly 300 includes hinge assembly 100 installed within enclosure assembly 200. In some embodiments, hinge assembly 100 may be installed within enclosure assembly 200 via a snap-fit assembly process. However, in other embodiments, a different assembly process and/or different means of retention (e.g., adhesives, fasteners, etc.) may be utilized to form installed hinge enclosure assembly 300.

FIG. 4 demonstrates the three axes of rotation enabled via the installation of hinge assembly 100 into enclosure assembly 200. These axes include: central axis 112, which permits rotation of the hinge components 110 relative to each other; first pin axis 114, which permits rotation of first enclosure component 210 relative to hinge assembly 100; and second pin axis 116 (not shown), which permits rotation of second enclosure component 220 relative to hinge assembly 100. In some embodiments, in addition to rotational movement, the geometry of hinge components 110 and the presence of rotational axes 112, 114, and 116 permit translational relative movement between the first enclosure component 210 and the second enclosure component 220 in either a horizontal or a vertical direction.

Figure 5:
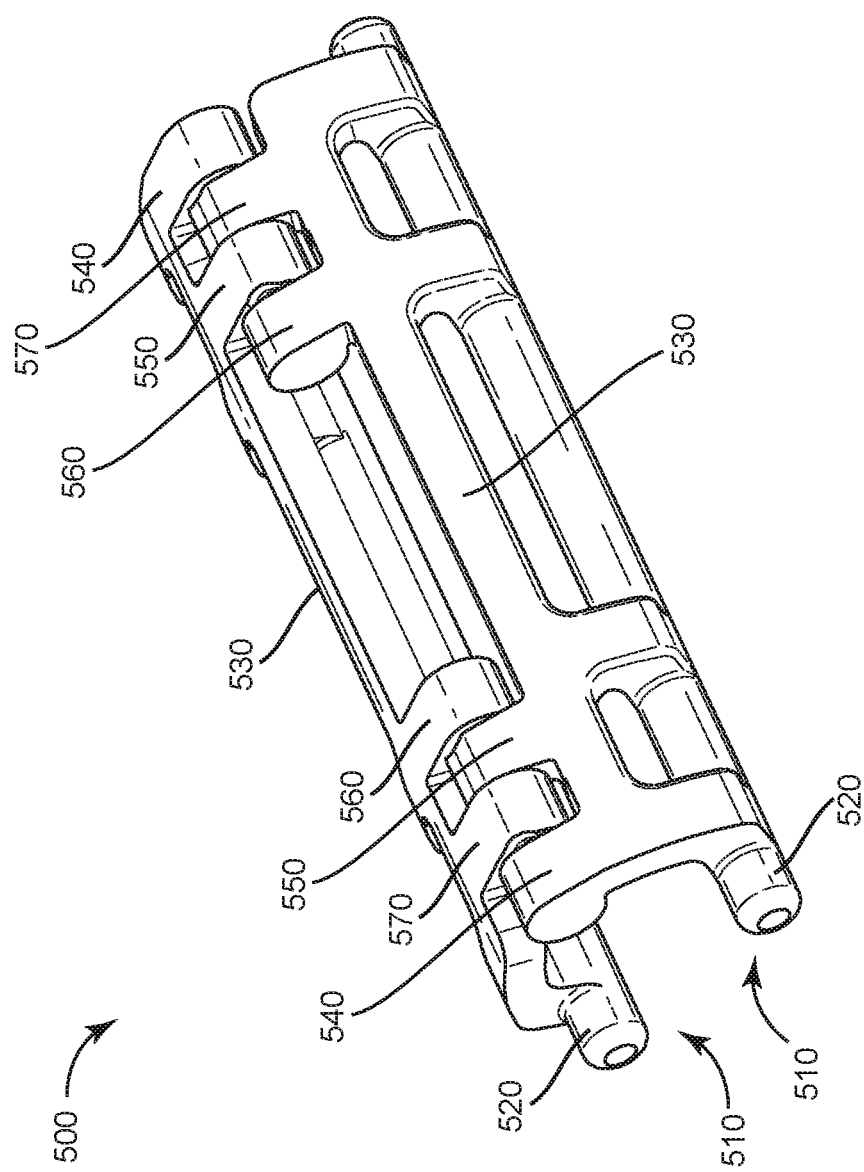
FIG. 5 is another perspective view of a three-axis symmetrical hinge assembly, according to some embodiments.
Figure 6:
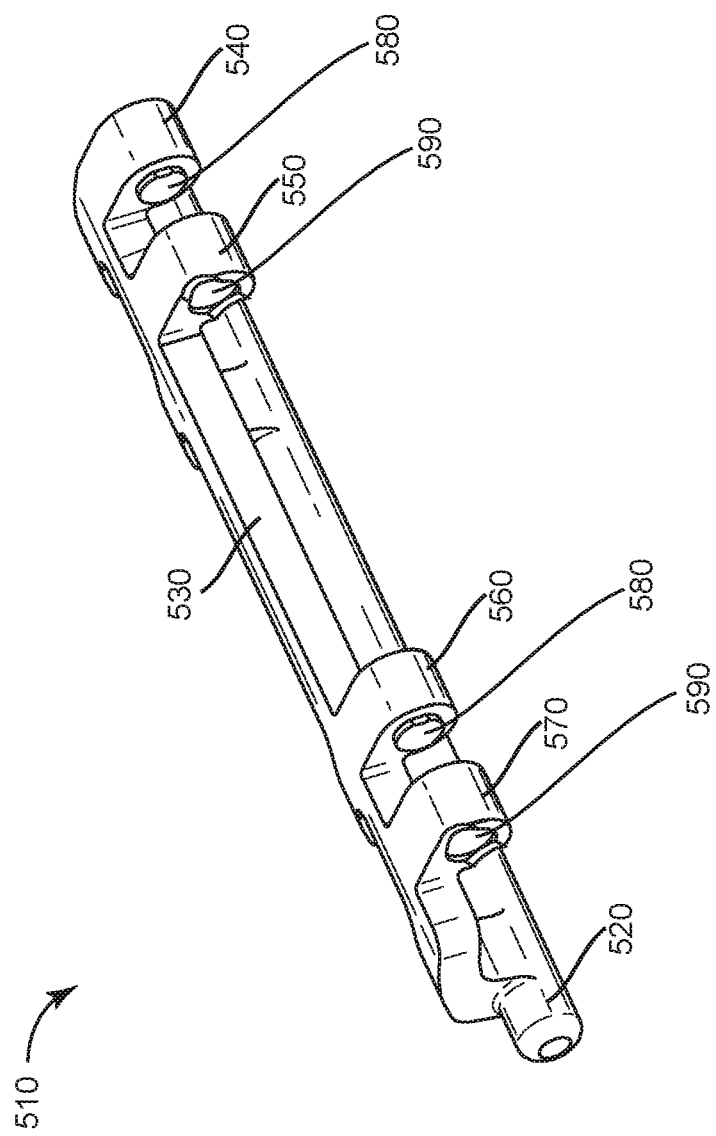
FIG. 6 is a perspective view of a component of the hinge assembly of FIG. 5, according to some embodiments.

Referring now to FIGS. 5-6, another example implementation of a hinge assembly 500 is depicted. Similar to hinge assembly 100, hinge assembly 500 includes two hinge components 510 rotatably coupled together along a central axis with 180 degree rotational symmetry. The extended length of hinge assembly 500 as compared to hinge assembly 100 may be advantageous when joining large device enclosure components.

Like hinge component 110, hinge component 510 is shown to include a pin portion 520 and a leaf portion 530. As described in further detail with reference to FIGS. 7 and 9 below, pin portion 520 may be configured to rotatably couple hinge assembly 500 to an electronics device enclosure via hinge receiving features. The leaf portion 530 of hinge component 510 terminates at a first knuckle 540, a second knuckle 550, a third knuckle 560, and a fourth knuckle 570. First knuckle 540 and third knuckle 560 are shown to include detent features 580, while second knuckle 550 and fourth knuckle 570 are shown to include indent features 590. Detent features 580 and indent features 590 may be configured to rotatably couple two hinge components 510 to each other.

Figure 7:
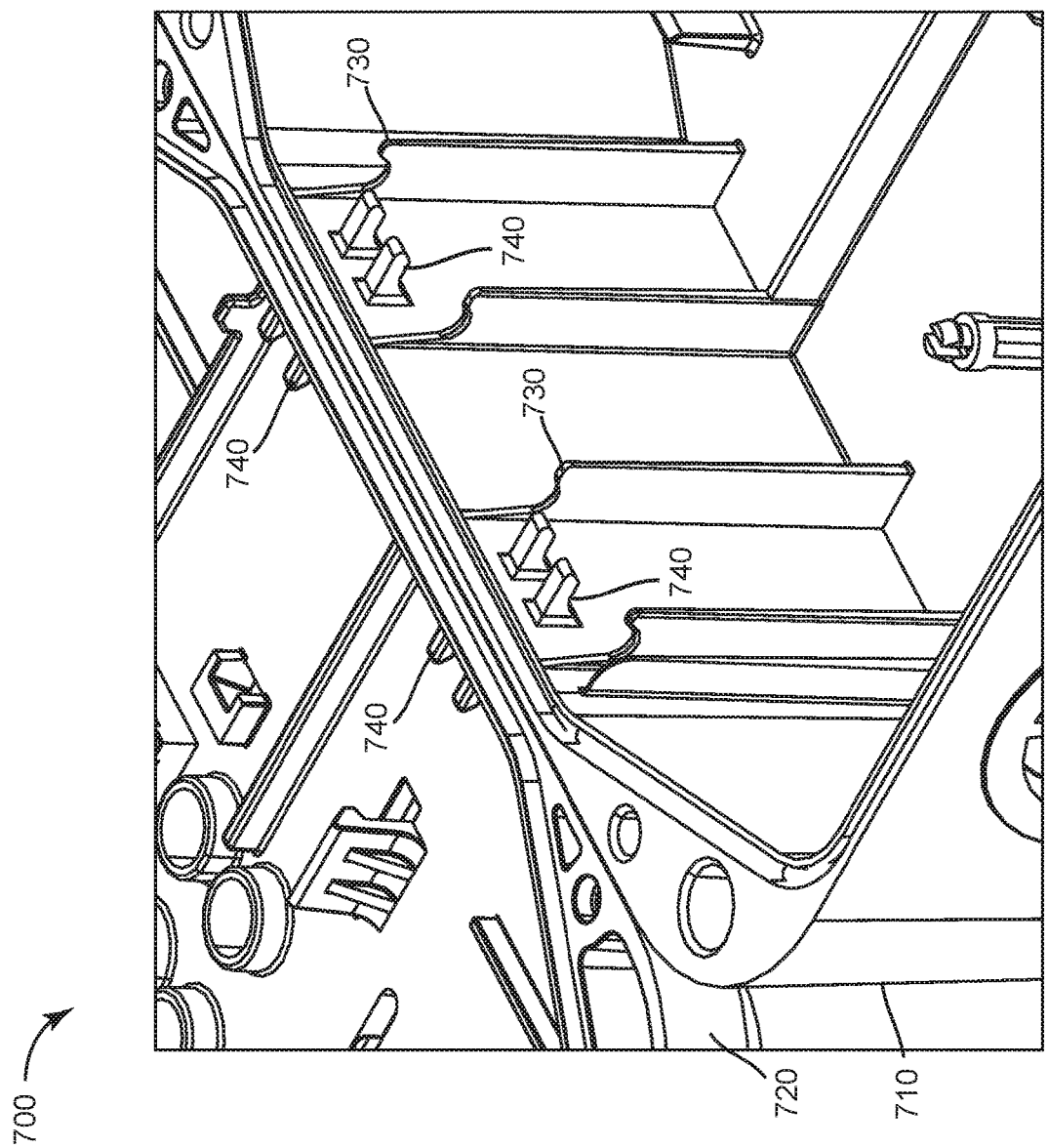
FIG. 7 is another perspective view of an electronics enclosure assembly, according to some embodiments.

Turning now to FIG. 7, a view of an electronics enclosure assembly 700 is depicted. In some embodiments, the electronics enclosure assembly 700 is a housing for a refrigeration control unit. As shown, enclosure assembly 700 may include a first enclosure component 710 and a second enclosure component 720. Both first enclosure component 710 and second enclosure component 720 may include a plurality of lower hinge receiving features 730 and upper hinge receiving features 740. For example, hinge receiving features 730 and 740 may include protrusions from a wall of each of the components 710 and 720. The protrusions may have a substantially curved shape and may be configured to receive and retain a feature of hinge component 510 (e.g., pin portion 520).

Figure 8:
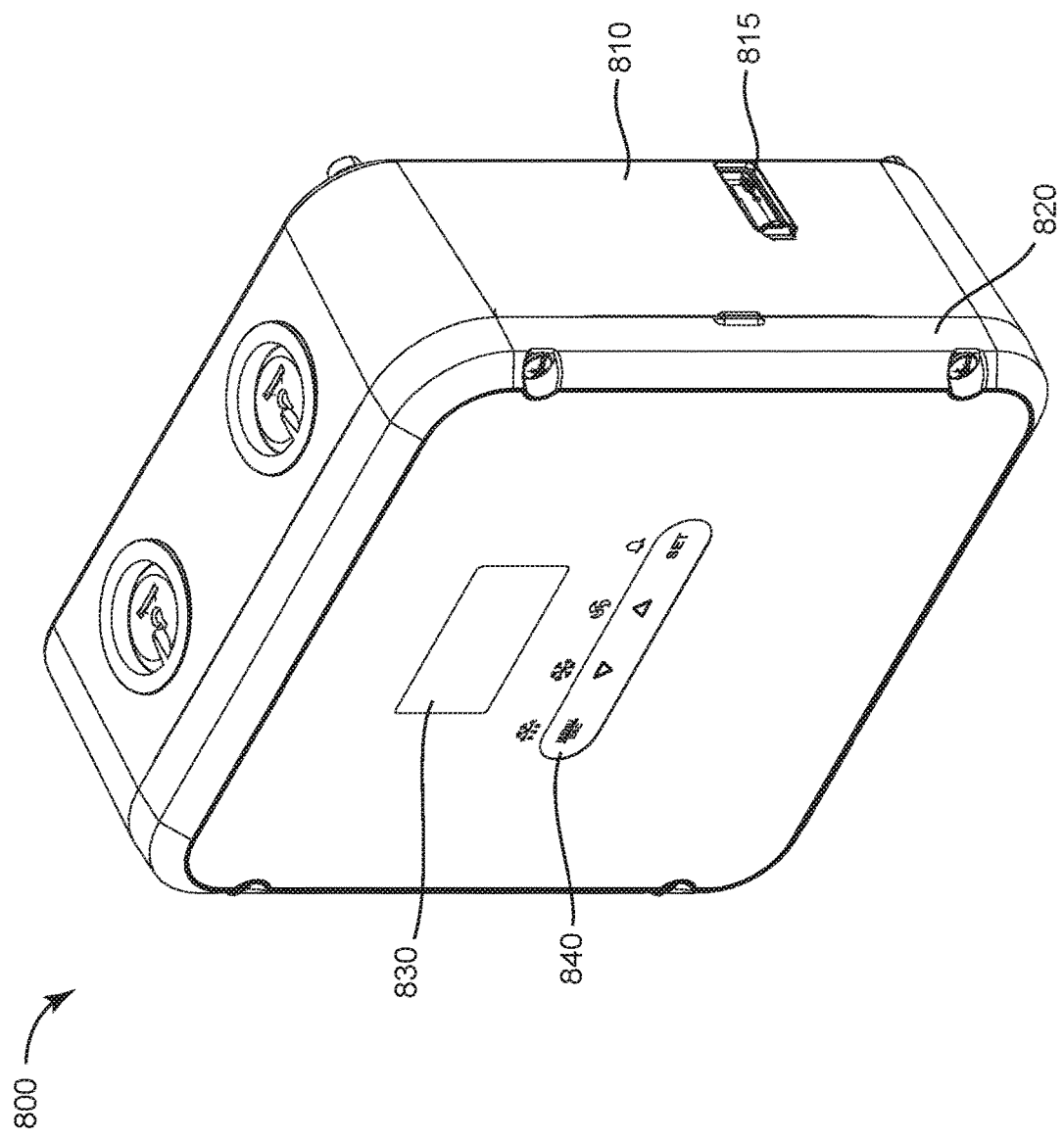
FIG. 8 is a perspective view of a refrigeration control unit, according to some embodiments.

FIG. 8 depicts a refrigeration control unit 800. Refrigeration control unit device 800 may be configured to control commercial refrigeration equipment, including walk-in refrigerators, coolers, and freezers installed in grocery stores, restaurants, and the like. In some embodiments, refrigeration control unit devices may also be used to control refrigeration and freezer cases for the display and distribution of food service products. As shown, refrigeration control unit 800 may include, among other components, a first enclosure component 810, a universal serial bus (USB) port 815, a second enclosure component 820, a display 830, and unit controls 840. Display 830 and unit controls 840 are described in further detail below with reference to FIGS. 12 and 13.

Figure 9:
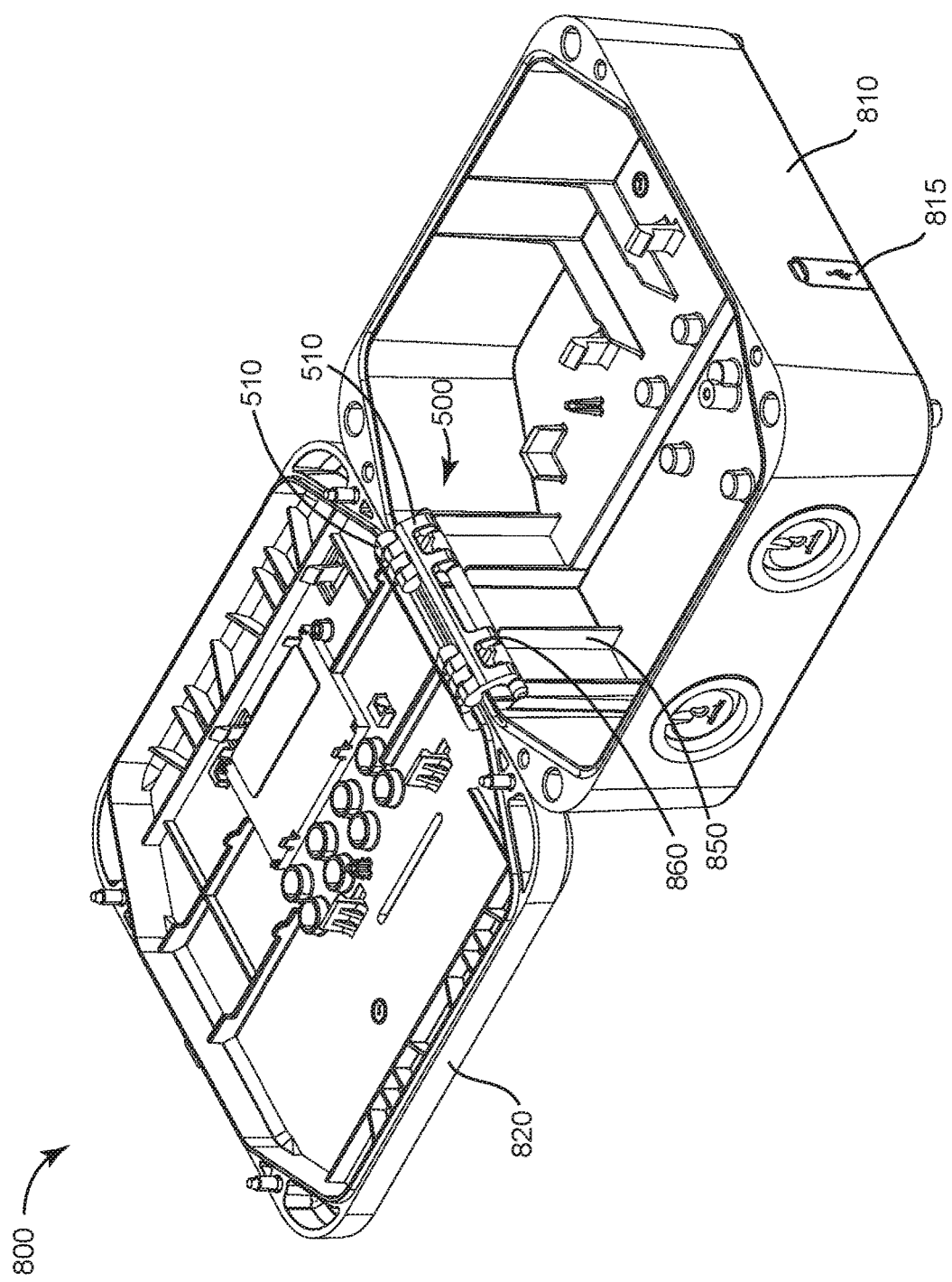
FIG. 9 is a perspective view of the hinge assembly of FIG. 5 installed in the refrigeration control unit of FIG. 8, according to some embodiments.

FIG. 9 depicts the interior of refrigeration control unit 800 with the electronic components (e.g., circuit card assemblies, connectors) not shown. First enclosure component 810 may be rotatably coupled to second enclosure component 820 via a hinge assembly 500. Similar to electronics enclosure assemblies described above, hinge assembly 500 is shown to couple to the first enclosure component 810 and the second enclosure component 820 via multiple upper and lower hinge receiving features 850 and 860. In some embodiments, hinge components 510 are configured to couple to upper and lower hinge receiving features 850 and 860 via a snap-fit assembly process.

Figure 10:
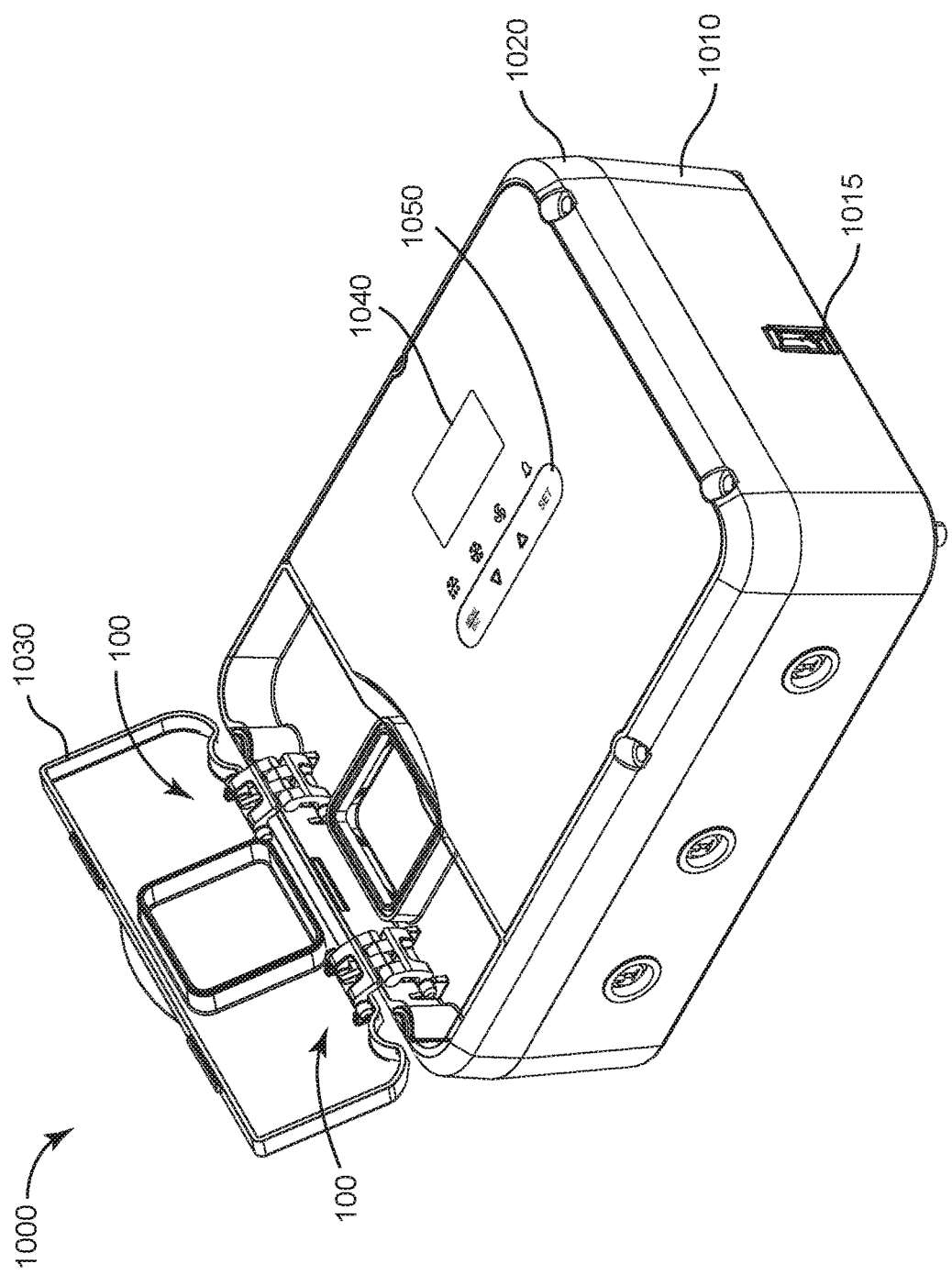
FIG. 10 is a perspective view of the hinge assembly of FIG. 1 installed in another refrigeration control unit, according to some embodiments.
Figure 11:
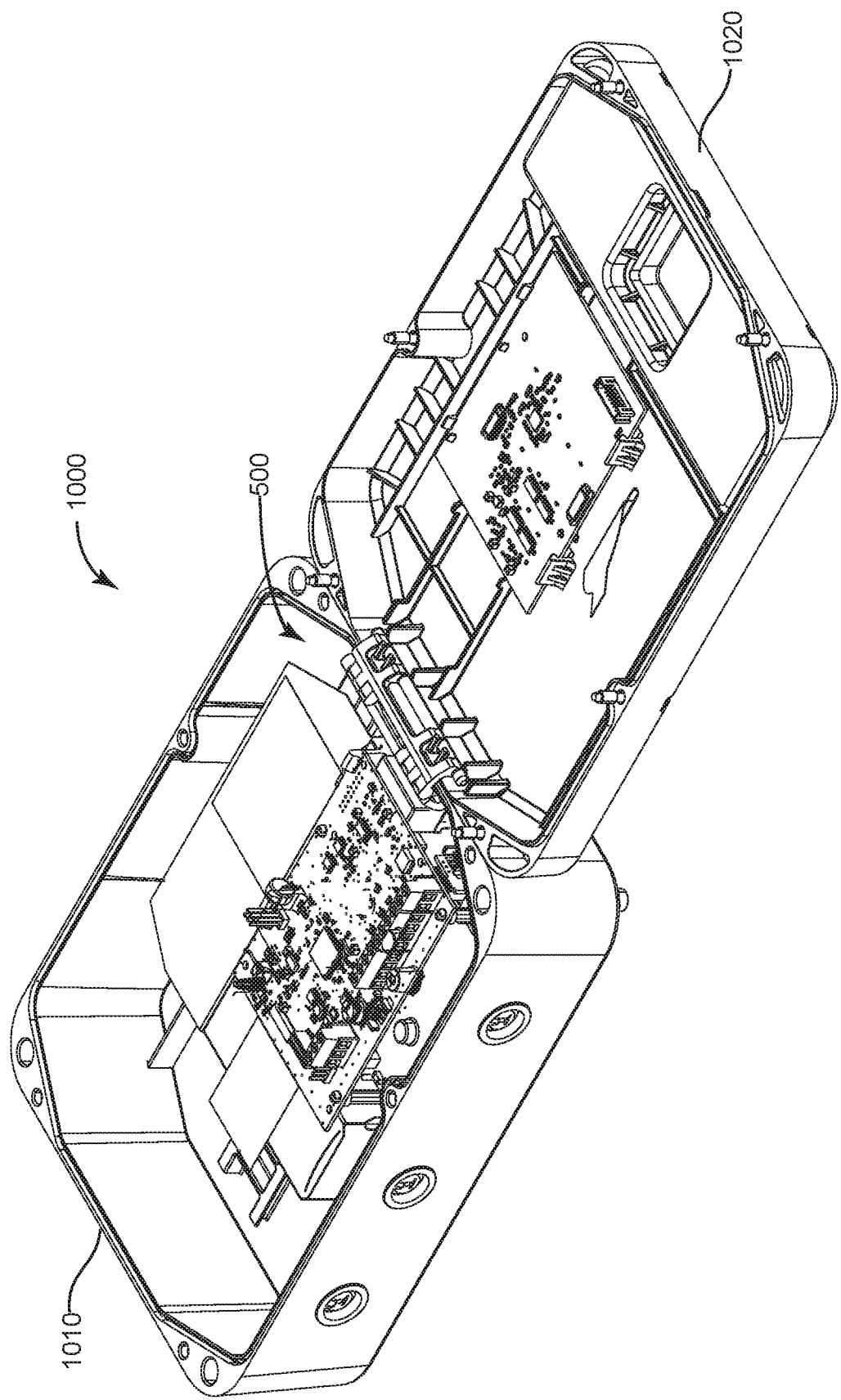
FIG. 11 is a perspective view of the hinge assembly of FIG. 5 installed in the refrigeration control unit of FIG. 10, according to some embodiments.

Referring now to FIGS. 10 and 11, another refrigeration control unit 1000 is depicted, according to an example embodiment. Similar to refrigeration control unit 800, refrigeration control unit 1000 is shown to include a first enclosure housing component 1010, a USB port 1015, a second enclosure housing component 1020, a display 1040, and unit controls 1050. In contrast to refrigeration control unit 800, refrigeration control unit 1000 is further shown to include a third enclosure housing component 1030. Third enclosure housing component 1030 is configured to be rotatably coupled to second enclosure housing component 1020 via a pair of hinge assemblies 100. In some embodiments, third enclosure housing component 1030 may provide access to circuit breaker components located within the refrigeration control unit 1000 without requiring a user to open the entire refrigeration control unit (e.g., rotation of second enclosure housing component 1020 relative to first enclosure housing component 1010). FIG. 11 depicts the interior of refrigeration control unit 1000. As shown, first enclosure housing component 1010 is rotatably coupled to second enclosure component 1020 via hinge assembly 500.

Figure 13:
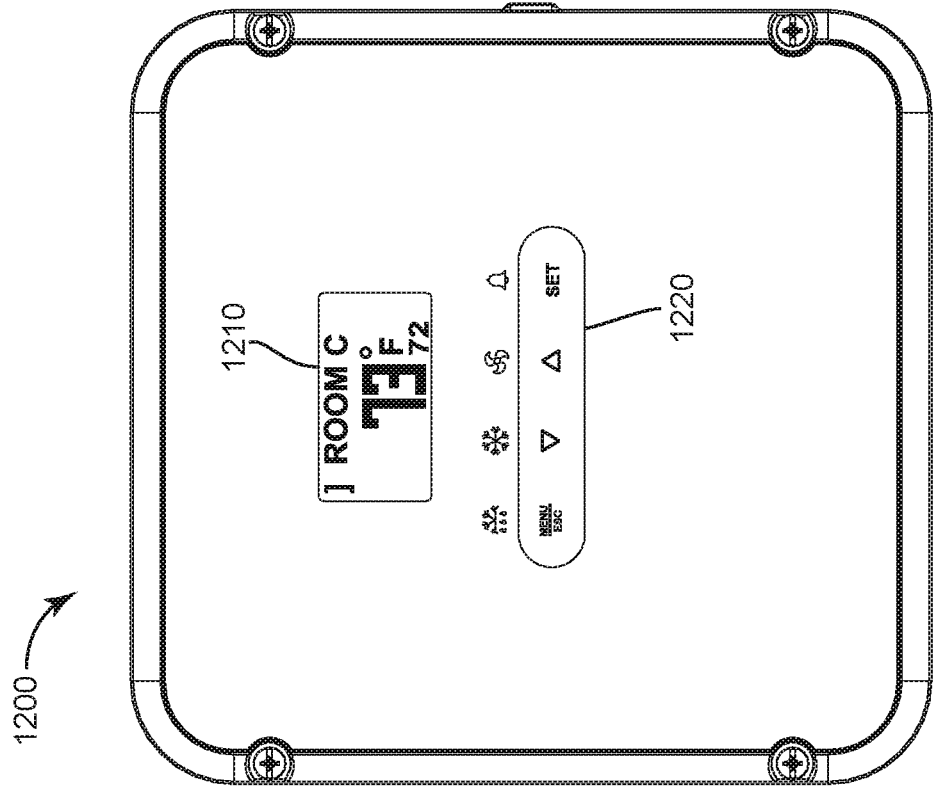
FIG. 13 is another front elevation view of a refrigeration control unit, according to some embodiments.
Figure 12:
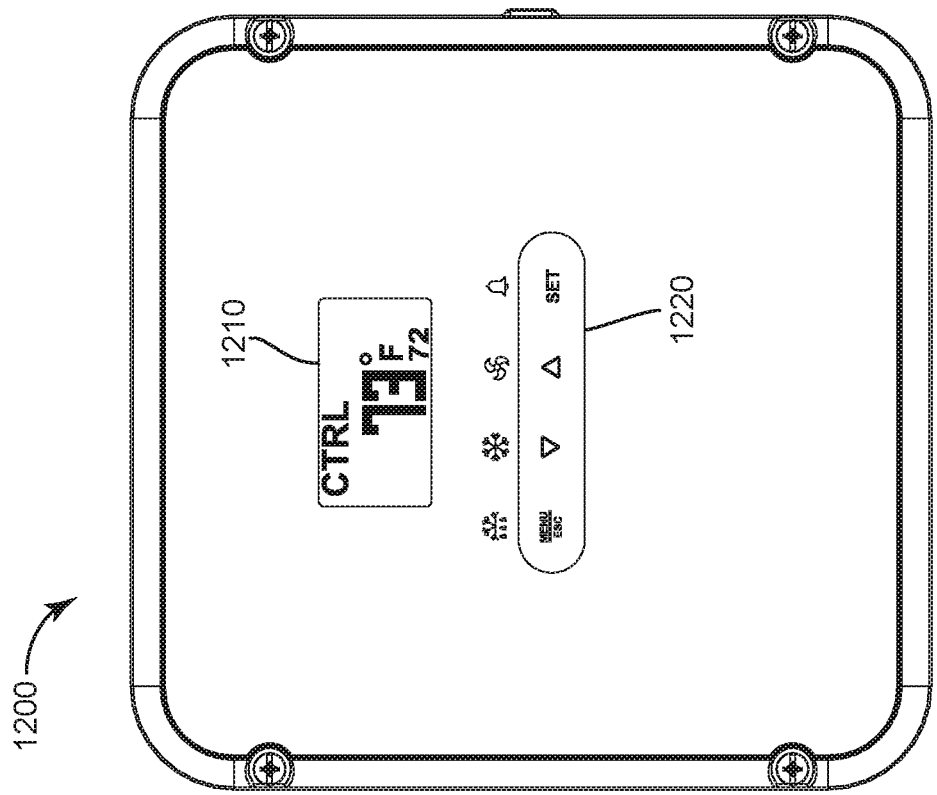
FIG. 12 is a front elevation view of a refrigeration control unit, according to some embodiments.

Turning now to FIGS. 12 and 13, views of a refrigeration unit control device 1200 are shown, according to some embodiments. In some embodiments, refrigeration unit control device 1200 is identical or substantially similar to refrigeration control units 800 and 1000. As shown, refrigeration unit control device 1200 includes, among other components, a display 1210 and unit controls 1220.

The display 1210 may include a seven segment dot matrix LCD display combined with a standard 3-digit segmented area for temperature display. The seven segment dot matrix LCD display may be configured to permit plain language information to scroll across the display in a variety of languages. For example, in FIG. 12, only the "CTRL" portion of the parameter "COLD ROOM CTRL" is visible at the top of the display 1210. In FIG. 13, which represents the display 1210 while the parameter is in a different scroll position, the portion of the parameter reading "D ROOM C" is visible. In addition to the scrolling parameter portion, the hybrid display 1210 may also be configured to display a setpoint temperature and/or a current temperature of the refrigeration unit. For example, as shown in FIGS. 12-13, the setpoint temperature of the unit may be 72° F., while the current temperature of the unit may be 73° F.

In addition to the LCD display 1210, refrigeration control unit 1200 may include several touch screen controls 1220. In various embodiments, the touch screen controls 1220 may include a MENU/ESC control, a down arrow control, an up arrow control, and a SET control. The MENU/ESC control may be configured to allow a user to navigate through a menu structure. In some embodiments, refrigeration control unit 1200 may organize menu items into easy-to-navigate functional groupings on display 1210 that are directly related to the control functionality of the refrigeration equipment. For example, these functional groupings may include Defrost Control, Alarming, System Set-up, Fan Control, and Temperature Control. In some embodiments, once a user has selected a functional group for programming, the user interface shown on display 1210 will automatically advance to the next programmable parameter, ensuring that all available parameters for the refrigeration equipment are programmed. In various embodiments, the down and up arrow controls may be configured to permit a user to scroll through a list of options for each parameter, while the SET control may be configured to permit a user to select the desired option for each parameter.

Figure 14:
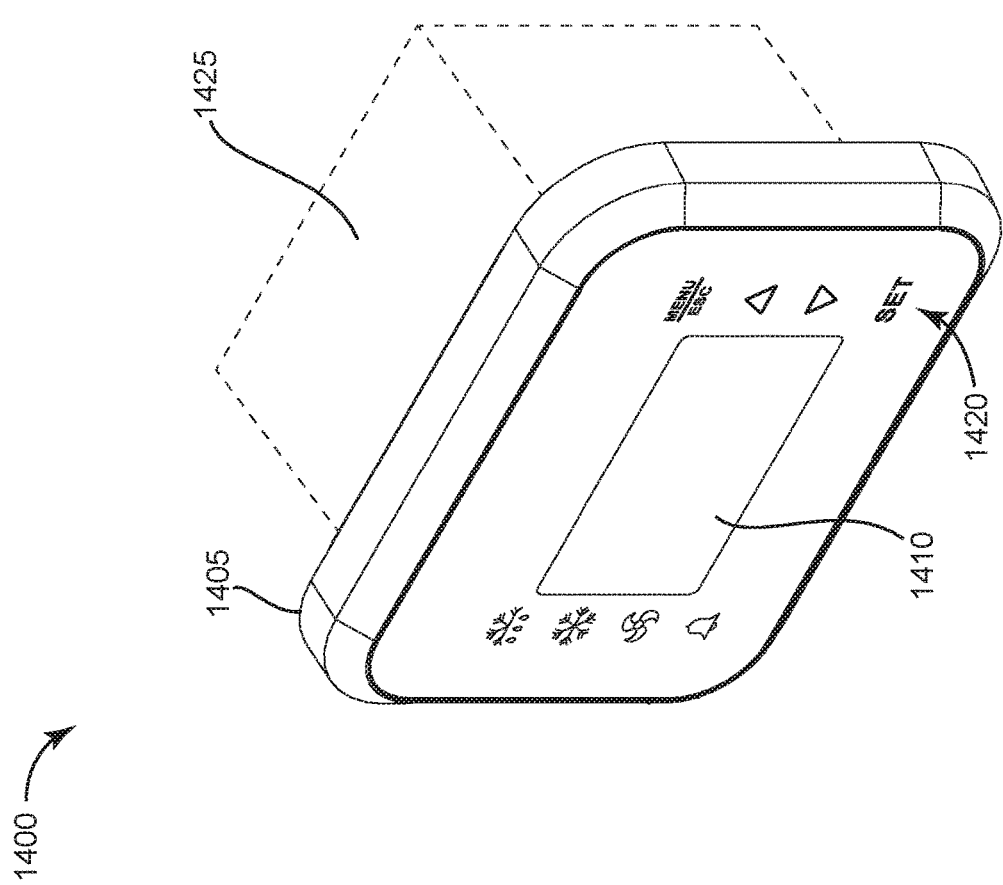
FIG. 14 is a perspective view of a refrigeration control unit, according to some embodiments.

Referring now to FIG. 14, another example implementation of a refrigeration control unit 1400 is depicted. Similar to refrigeration control units 800 and 1000, refrigeration control unit 1400 is shown to include a display head 1405 with a display 1410 and unit controls 1420. As shown, the display head 1405 may be coupled to an electronics unit 1425. Although smaller in form factor than refrigeration control units 800 and 1000, refrigeration control unit 1400 may be configured to perform many of the same functions as refrigeration control units 800 and 1000. For example, approximately 80-90% of the firmware for refrigeration control unit 1400 may be identical to the firmware of refrigeration control unit 800.

Figure 15:
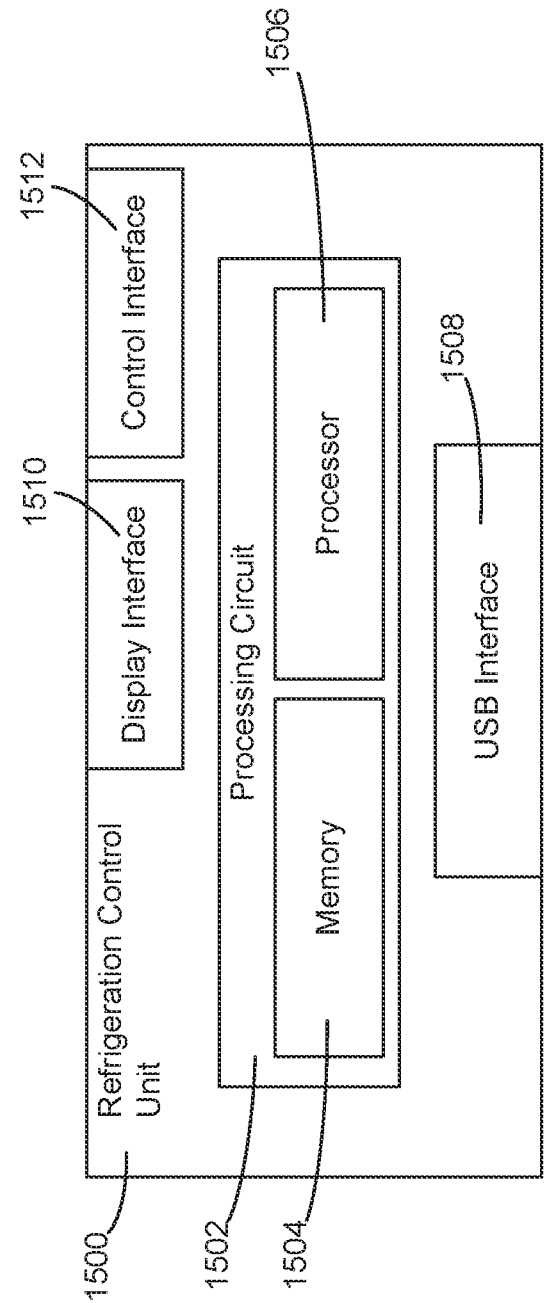
FIG. 15 is a block diagram of a refrigeration control unit, according to some embodiments.

Turning now to FIG. 15, a block diagram of a refrigeration control unit 1500 is depicted, according to some embodiments. In various embodiments, refrigeration control unit 1500 is identical or substantially similar to refrigeration control units 800, 1000, and 1400, as described above. Refrigeration control unit 1500 is shown to include a processing circuit 1502. Processing circuit 1502 can be communicably connected to USB interface 1508, display interface 1510, and control interface 1512 such that processing circuit 1502 and the various components thereof can send and receive data via interfaces 1508-1512.

Processing circuit 1502 may include memory 1504 and a processor 1506. Processor 1506 can be implemented as a general purpose processor, an application specific integrated circuit (ASIC), one or more field programmable gate arrays (FPGAs), a group of processing components, or other suitable electronic processing components. Memory 1504 (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present application. Memory 1504 can be or include volatile memory or non-volatile memory. Memory 1504 may include database components, object code components, script components, or any other type of information structure for supporting the various activities and information structures described in the present application. According to some embodiments, memory 1504 is communicably connected to processor 1506 via processing circuit 1502 and includes computer code for executing (e.g., by processing circuit 1502 and/or processor 1506) one or more processes described herein. In various embodiments, the processing circuit may be communicably coupled to various components of the refrigeration equipment (not shown) and control signals transmitted to the refrigeration equipment from the processing circuit 1502 may modify an operating condition of the refrigeration equipment.

Refrigeration control unit 1500 is further shown to include a USB interface 1508, a display interface 1510, and a control interface 1512. USB interface 1508 may be communicably coupled to a USB port (e.g., USB port 815, USB port 1015) accessible from the exterior of the refrigeration control unit 1500. In some embodiments, USB interface 1508 may be used to update control unit firmware. For example, as updates to the system become available, a user may obtain the updated firmware and upload it to control unit 1500 via USB interface 1508. Display unit interface 1510 may be communicably coupled to a display (e.g., display 830, display 1040, display 1410), while control interface 1512 may be communicably coupled to unit controls (e.g., touch screen controls 840, touch screen controls 1050, touch screen controls 1420). Based on data received from the unit controls via the control interface 1512, the processing circuit 1502 may execute processes and output data (e.g., selected refrigeration unit parameters) that are displayed on the unit display 1510.

Numerous specific details are described to provide a thorough understanding of the disclosure. However, in certain instances, well-known or conventional details are not described in order to avoid obscuring the description. References to "some embodiments," "one embodiment," "an exemplary embodiment," and/or "various embodiments" in the present disclosure can be, but not necessarily are, references to the same embodiment and such references mean at least one of the embodiments.

Alternative language and synonyms may be used for any one or more of the terms discussed herein. No special significance should be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

The elements and assemblies may be constructed from any of a wide variety of materials that provide sufficient strength or durability, in any of a wide variety of colors, textures, and combinations. Further, elements shown as integrally formed may be constructed of multiple parts or elements.

As used herein, the word "exemplary" is used to mean serving as an example, instance or illustration. Any implementation or design described herein as "exemplary" is not necessarily to be construed as preferred or advantageous over other implementations or designs. Rather, use of the word exemplary is intended to present concepts in a concrete manner. Accordingly, all such modifications are intended to be included within the scope of the present disclosure. Other substitutions, modifications, changes, and omissions may be made in the design, operating conditions, and arrangement of the preferred and other exemplary implementations without departing from the scope of the appended claims.

As used herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

As used herein, the term "coupled" means the joining of two members directly or indirectly to one another. Such joining may be stationary in nature or moveable in nature and/or such joining may allow for the flow of fluids, electricity, electrical signals, or other types of signals or communication between the two members. Such joining may be achieved with the two members or the two members and any additional intermediate members being integrally formed as a single unitary body with one another or with the two members or the two members and any additional intermediate members being attached to one another. Such joining may be permanent in nature or alternatively may be removable or releasable in nature.

Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. An electronic device enclosure, comprising:
a first enclosure component;
a second enclosure component configured to couple to the first enclosure component to encapsulate electronic device components; and
a three-axis hinge assembly rotatably coupled to both the first enclosure component and the second enclosure component, the three-axis hinge assembly configured to rotatably couple the first enclosure component to the second enclosure component, the three-axis hinge assembly comprising:
first and second identical hinge components, each of the first and second hinge components comprising a leaf portion terminating in a first knuckle and a second knuckle, the first knuckle comprising a first protrusion and the second knuckle comprising a first recess; and
wherein the first protrusion of the first hinge component is configured to fit within the first recess of the second hinge component, and the first protrusion of the second hinge component is configured to fit within the first recess of the first hinge component.

2. The electronic device enclosure of claim 1, wherein at least one of the first hinge component and the second hinge component is fabricated from acetal resin.

3. The electronic device enclosure of claim 1, wherein at least one of the first protrusion and the first recess has a substantially semi-spherical shape.

4. The electronic device enclosure of claim 1, wherein the electronic device components comprise a refrigeration control unit.

5. The electronic device enclosure of claim 1, wherein the first hinge component and the second hinge component each further comprise a third knuckle and a fourth knuckle, the third knuckle comprising a second protrusion and the fourth knuckle comprising a second recess.

6. The electronic device enclosure of claim 5, wherein the second protrusion of the first hinge component is configured to fit within the second recess of the second hinge component, and the second protrusion of the second hinge component is configured to fit within the second recess of the first hinge component.

7. The electronic device enclosure of claim 1, wherein the first hinge component and the second hinge component each further comprise a pin member portion, the pin member portion configured to pivotally couple to a plurality of hinge receiving features located on the first enclosure component and the second enclosure component.

8. A refrigeration control unit configured to modify an operating condition of a refrigeration unit, comprising:
- a first device housing component;
- a second device housing component;
- a three-axis hinge assembly configured to rotatably couple the first device housing component to the second device housing component;
- a plurality of touch screen controls configured to permit selection of refrigeration unit operating parameters;
- a liquid crystal display; and
- a processing circuit communicably coupled to the plurality of touch screen controls and the liquid crystal display, the processing circuit configured to:
  - receive a selected refrigeration unit operating parameter via the plurality of touch screen controls; and
  - transmit a signal to display a plurality of selected refrigeration unit operating parameters in a scrolling display format on the liquid crystal display.

9. The refrigeration control unit of claim 8, wherein the three-axis hinge assembly comprises:
- a first hinge component rotatably coupled to the first device housing component and comprising a leaf portion terminating in a first knuckle and a second knuckle, the first knuckle comprising a first protrusion and the second knuckle comprising a first recess; and
- a second hinge component rotatably coupled to the second device housing component that is structurally identical to the first hinge component;
- wherein the first protrusion of the first hinge component is configured to fit within the first recess of the second hinge component, and the first protrusion of the second hinge component is configured to fit within the first recess of the first hinge component.

10. The refrigeration control unit of claim 9, wherein the first hinge component and the second hinge component each further comprise a third knuckle and a fourth knuckle, the third knuckle comprising a second protrusion and the fourth knuckle comprising a second recess.

11. The refrigeration control unit of claim 8, wherein the refrigeration unit is at least one of a walk-in refrigerator, a cooler, or a freezer.

* * * * *